United States Patent
Tokuno et al.

(10) Patent No.: US 8,133,327 B2
(45) Date of Patent: Mar. 13, 2012

(54) SUBSTRATE PROCESSING METHOD, STORAGE MEDIUM AND SUBSTRATE PROCESSING APPARATUS

(75) Inventors: Yoshichika Tokuno, Fukuoka-Ken (JP); Hiroshi Nagayasu, Kasuga (JP)

(73) Assignee: Tokyo Electron Limited, Minato-Ku, Tokyo-To (JP)

( * ) Notice: Subject to any disclaimer, the term of this patent is extended or adjusted under 35 U.S.C. 154(b) by 837 days.

(21) Appl. No.: 11/886,662

(22) PCT Filed: Mar. 29, 2007

(86) PCT No.: PCT/JP2007/056820
§ 371 (c)(1),
(2), (4) Date: Sep. 19, 2007

(87) PCT Pub. No.: WO2007/111369
PCT Pub. Date: Oct. 4, 2007

(65) Prior Publication Data
US 2009/0014033 A1 Jan. 15, 2009

(30) Foreign Application Priority Data
Mar. 29, 2006 (JP) .................. 2006-090297

(51) Int. Cl.
*B08B 3/04* (2006.01)
(52) U.S. Cl. .......... 134/26; 134/2; 134/18; 134/21; 134/25.4; 134/28; 134/30; 134/31; 134/32; 134/33; 134/34; 134/36; 134/37; 134/41; 134/42; 134/902; 34/73; 34/77; 34/340; 34/341; 34/350; 34/351; 34/474; 34/477; 34/491

(58) Field of Classification Search ............... 134/2, 18, 134/21, 25.4, 26, 28, 30, 31, 32, 33, 34, 36, 134/37, 41, 42, 902; 34/73, 77, 340, 341, 34/350, 351, 474, 477, 491
See application file for complete search history.

(56) References Cited

U.S. PATENT DOCUMENTS
6,001,191 A 12/1999 Kamikawa et al.
(Continued)

FOREIGN PATENT DOCUMENTS
DE 696 20 372 T2 11/2002
(Continued)

OTHER PUBLICATIONS
English language version of International Search Report Corresponding to International Application No. PCT/JP2007/056820 dated May 1, 2007.
(Continued)

*Primary Examiner* — Bibi Carrillo
(74) *Attorney, Agent, or Firm* — Smith, Gambrell & Russell, LLP (57) ABSTRACT

Provided is a substrate processing method that prevents generation of watermarks on a substrate and can be performed at a low cost. The method controls the ambient humidity around the substrate depending on the kind of the chemical liquid, when the substrate is processed with the chemical liquid. The control of the humidity is performed at least in a drying step that dries the substrate W. In one embodiment, the ambient humidity around the substrate is controlled when a fluid containing IPA as a drying fluid is supplied to the substrate W after processing the substrate W with the chemical liquid.

10 Claims, 6 Drawing Sheets

U.S. PATENT DOCUMENTS

| | | | |
|---|---|---|---|
| 6,248,670 B1 * | 6/2001 | Hung et al. | 438/745 |
| 6,834,440 B2 * | 12/2004 | Lee | 34/58 |
| 2004/0060605 A1 * | 4/2004 | Jhurani | 137/614.2 |
| 2005/0026455 A1 * | 2/2005 | Hamada et al. | 438/782 |
| 2006/0219258 A1 * | 10/2006 | Gast | 134/2 |
| 2007/0017555 A1 | 1/2007 | Sekiguchi et al. | |
| 2007/0223342 A1 * | 9/2007 | Orii et al. | 369/69 |
| 2008/0093340 A1 * | 4/2008 | Nakamori et al. | 216/57 |
| 2008/0127508 A1 * | 6/2008 | Ohno et al. | 34/552 |

FOREIGN PATENT DOCUMENTS

| | | |
|---|---|---|
| EP | 0 782 889 B1 | 4/2002 |
| EP | 1 801 860 | 6/2007 |
| JP | 6-9130 U | 2/1994 |
| JP | 10-22257 | 1/1998 |
| JP | 2002-110609 | 4/2002 |
| JP | 2002-198348 | 7/2002 |
| JP | 2004-228594 | 8/2004 |
| JP | 2005-244127 | 9/2005 |
| JP | 2006-80501 | 3/2006 |
| JP | 2007-036180 | 2/2007 |
| WO | 2005/098918 | 10/2005 |
| WO | WO 2006/041077 | 12/2005 |
| WO | WO 2006/137202 | 3/2006 |

OTHER PUBLICATIONS

Publication Cover Sheet WO 2007/111369 A1 corresponding to present application PCT/JP2007/056820 published on Oct. 4, 2007.
German Office Action issued on Feb. 18, 2010 for a corresponding application 112007000442.8 (w/English translation).
PCT Notification of Transmittal of Translation of the International Preliminary Examination Report (Form PCT/IB/338) for PCT/JP2006/305140 dated Jan. 2004.
PCT International Preliminary Report on Patentability (Form PCT/IB/373) for PCT/JP2006/305140 dated Jan. 2004.
PCT Written Opinion of the International Searching Authority (Form/ISA/237) for PCT/JP2006/305140 dated Apr. 2005.
Japanese Office Action issued on Feb. 4, 2010 for a corresponding application JP2008-023342 (w/English translation).
Japanese Office Action issued on Feb. 4, 2010 for a corresponding application JP2008-0144595 (w/English translation).
"Regarding duty to disclose information to the USPTO", dated Mar. 5, 2010.
Japanese language original and English language translation of an Office Action issued in corresponding Japanese Application No. 2006-090297 dated Dec. 4, 2007.
Taiwan Office Action issued on Sep. 13, 2010 for Taiwan Application No. 096111103 w/English translation.

* cited by examiner

FIG. 7

SUBSTRATE PROCESSING METHOD, STORAGE MEDIUM AND SUBSTRATE PROCESSING APPARATUS

TECHNICAL FIELD

The present invention relates to a substrate processing method, storage medium, and a substrate processing apparatus.

BACKGROUND ART

In the production process for semiconductor devices, a cleaning process of cleaning a semiconductor wafer (hereinafter referred to as "wafer") with process solutions such as a chemical liquid and a rinse liquid is conducted. In such a cleaning process, after performing a chemical liquid processing step that supplies a chemical liquid such as DHF (diluted hydrofluoric acid) solution to the wafer and a rinsing step that supplies a rinse liquid such as deionized water to the wafer, a drying step for drying the wafer is performed.

As one example of a method of drying the wafer, a vapor drying method that exposes the wafer to a vapor of an organic solvent such as IPA (isopropyl alcohol) has been known. Further, in order to suppress generation of water marks during a drying step, a method of supplying dehumidified air thereby to lower the ambient humidity around the wafer has been proposed (for example, refer to Japanese Utility Model Laid Open Publication: JP 6-9130U).

In order to reduce the ambient humidity around the wafer, a great amount of dehumidified air has to be supplied. This increases the cost requiring for the processing of the wafer. In particular, in a case where a substrate processing apparatus conducts a processing step selected from several types of processing steps in one processing chamber (processing space) or in a case where the substrate processing apparatus conducts plural types of processing steps continuously, lowering of the ambient humidity around the wafer in all the processing steps results in remarkable increase in the processing cost.

DISCLOSURE OF THE INVENTION

The present invention has been accomplished in view of the foregoing, and the object of the present invention is to provide a technique for processing a substrate capable of preventing generation of water marks on a substrate and reducing the cost for air-conditioning.

The invention has been made based on the findings obtained as a result of study made by the present inventors that there are a case in which the drying process should be conducted in a dehumidified atmosphere, and a case in which it is not indispensable to conduct the drying process in the dehumidified atmosphere, depending on the kind of a chemical liquid with which a substrate is processed (i.e., kind of the process applied to the substrate).

In order to achieve the foregoing objective, the present invention provides a substrate processing method that processes a substrate with a chemical liquid and thereafter dries the substrate, including a step of controlling an ambient humidity around the substrate depending on a kind of the chemical liquid.

With the substrate processing method, the humidity may be controlled at least when the substrate being dried.

A fluid containing IPA (isopropyl alcohol) may be supplied after the substrate is processed with the chemical liquid, and the humidity may be controlled when the fluid containing IPA is being supplied.

The method may conducts: a chemical liquid processing step that processes the substrate with the chemical liquid; a rinse processing step that processes the substrate with a rinse liquid; a liquid film forming step that supplies a fluid containing IPA to an upper surface of the substrate to form a liquid film thereon; and a drying step that dries the substrate, and the humidity may be controlled at least in the liquid film forming step and/or in the drying step.

In a case where hydrophobicity of the substrate after the substrate is processed with the chemical liquid is to be increased as compared with that before the substrate is processed with the chemical liquid, the humidity may be set to be lower, through controlling of the humidity, than that in a case where the hydrophobicity of the substrate is not to be increased.

In a case where the chemical liquid is DHF (diluted hydrofluoric acid) solution or HF (hydrofluoric acid solution), the humidity may be set to be lower, through controlling of the humidity, than that in a case where the chemical liquid is SC-1 solution or SC-2 solution.

According to the present invention, there is also provided a substrate processing method that processes a substrate with a plurality of kinds of chemical liquids and thereafter dries the substrate, the method including: a first chemical liquid processing step that processes the substrate with a first chemical liquid; a second chemical liquid processing step that processes the substrate with a second chemical liquid after the first chemical liquid processing step; and a drying step that dries the substrate after the second chemical liquid processing step; wherein, at least in the drying step, ambient humidity of around the substrate is reduced to a lower level than that in the first chemical liquid processing step. The second chemical liquid may be DHF (diluted hydrofluoric acid) solution.

The dew point temperature may be set to −40° C. or lower when reducing the humidity. The humidity may be controlled by switching between a state of supplying a clean air supplied from a fan filter unit to a space surrounding the substrate and a state of supplying a low dew point gas having humidity lower than that of the clean air. The low dew point gas may be a clean dry air or nitrogen gas.

Further, according to the present invention, there is provided a storage medium storing software capable of being executed by a control computer of a substrate processing apparatus for performing a chemical liquid process and a drying process to a substrate, wherein the software is configured to cause the substrate processing apparatus to perform the foregoing substrate processing method when the software is executed by the control computer.

Further, according to the present invention, there is provided a substrate processing apparatus that processes a substrate with a chemical liquid, the apparatus including: a plurality of chemical liquid supply sources that supply different kinds of chemical liquids, respectively; a humidity control mechanism that controls ambient humidity of around the substrate; and a controller that controls the humidity control mechanism; wherein the controller controls the humidity around the substrate depending on the a kind of the chemical liquid.

The substrate processing apparatus may include a fluid supply source that supplies a fluid containing IPA, wherein the controller may be configured to control the humidity at least when the fluid containing IPA is being supplied to the substrate.

The controller may control the humidity such that, in a case where hydrophobicity of the substrate is to be increased by supplying the chemical liquid, the humidity is set to be lower than that in a case where the hydrophobicity of the substrate is not to be increased.

The controller may control the humidity such that, in a case where the chemical liquid is DHF (diluted hydrofluoric acid) solution, the humidity is set to be lower than that in a case where the chemical liquid is SC-1 solution or SC-2 solution.

Further, according to the present invention, there is provided a substrate processing apparatus that processes a substrate with a chemical liquid, the apparatus including: a plurality of chemical liquid supply sources that supply different kinds of chemical liquids, respectively; a humidity control mechanism that controls ambient humidity of around the substrate; and a controller that controls the humidity control mechanism; wherein the controller is configured to control said apparatus such that a first chemical liquid processing step that processes the substrate with a first chemical liquid, a second chemical liquid processing step that processes the substrate with a second chemical liquid after the first chemical liquid processing step, and a drying step that dries the substrate after the second chemical liquid processing step, and configured to control the ambient humidity around the substrate such that the ambient humidity at least in the drying step is lower than that in the first chemical liquid processing step. The second chemical liquid may be DHF solution.

A dew point temperature may be set to −40° C. or lower when the humidity is reduced. The substrate processing apparatus may be configured to have: a FFU (fan filter unit) that supplies clean air; and a low dew point gas supply source that supplies a low dew point gas having a humidity lower than that of the clean air, and configured to switch between a state of supplying the clean air and a state of supplying the low dew point gas to the surrounding of the substrate. The substrate processing apparatus may be provided with an intake cup that receives the clean air supplied from the FFU; a clean air supply channel that introducing the clean air in the intake cup to a space surrounding the substrate; and a clean air exhaust port that exhausts the clean air in the intake cup to a space outside the intake cup.

The substrate processing apparatus may include: a main supply channel that introduces the clean air or the low dew point gas into a space surrounding the substrate; a clean air supply channel that introduces the clean air supplied from the FFU into the main supply channel; and a low dew point gas supply channel that introduces the low dew point gas supplied from the low dew point gas supply source into the main supply channel; and a switching unit may be provided to switch between a state where the clean supply channel and the main supply channel are communicated and a state where the clean supply channel and the main supply channel are not communicated. In the switching unit, a downstream end of the clean air supply channel may be directed so as to discharge the clean air toward an upstream end of the main supply channel. The clean air supply channel and the main supply channel may extend along a common straight line. The low dew point gas supply channel may be connected through the switching unit to the main supply channel. A downstream end of the dew point gas supply channel may be directed so as to discharge the low dew point gas toward a position which is different from the upstream end of the main supply channel. The low dew point gas may be clean dry air or a nitrogen gas.

According to the invention, also in the case where plural types of processing steps can be conducted selectively in one chamber or in the case where plural types of processing steps are conducted successively in one chamber, the ambient humidity around the substrate can be reduced only when it is necessary by controlling the ambient humidity of the substrate depending in the kind of the chemical liquid supplied to the substrate. Accordingly, the cost required for reducing the ambient humidity around the substrate can be reduced. For example, the amount of supply and the cost of the low dew point gas such as CDA can be reduced. This can reduce the cost required for the processing of the substrate. Further, generation of water marks to the substrate can be prevented by optionally decreasing the humidity.

BEST MODE FOR CARRYING OUT THE INVENTION

Figure 1:
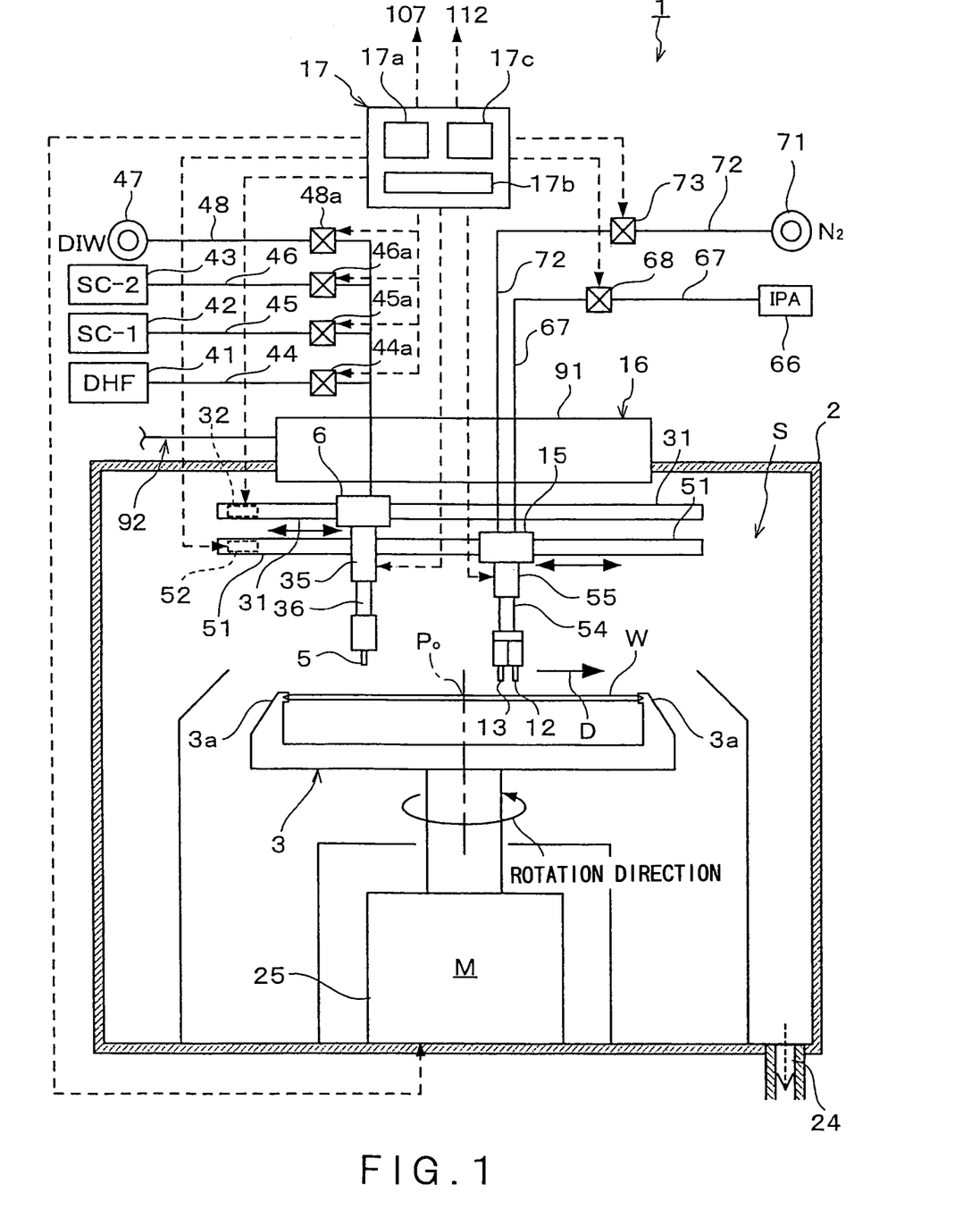
FIG. 1 is a schematic vertical cross sectional view of a substrate processing apparatus in one embodiment of the present invention.

As a preferred embodiment of the present invention, a substrate processing apparatus for cleaning the surface of a silicon wafer W as a substrate will be described. As shown in FIG. 1, in a chamber 2 of a substrate processing apparatus 1 in this embodiment, a spin chuck 3 is disposed to hold a disk-shaped wafer W substantially horizontally. In the chamber 2, there is provided a nozzle 5 serving as a chemical liquid nozzle for selectively supplying, for example, DHF solution (diluted hydrofluoric acid), SC-1 solution (a mixed solution of ammonia, hydrogen peroxide, and water), and SC-2 solution (a mixed solution of hydrochloric acid, hydrogen peroxide, and water) and also serving as a chemical liquid for cleaning and as a rinse liquid nozzle for supplying, for example, deionized water (DIW) as a rinse liquid to a wafer W. The nozzle 5 is supported by a nozzle arm 6. In the chamber 2, a fluid nozzle 12 and an inert gas nozzle 13 are further provided. The fluid nozzle 12 supplies an IPA-containing fluid, for example, IPA (isopropyl alcohol) liquid as a fluid of a higher volatility than deionized water which is a rinse liquid. The inert gas nozzle 13 as a drying gas nozzle is to supply an inert gas, for example, a nitrogen ($N_2$) gas as a drying gas. The fluid nozzle 12 and the inert gas nozzle 13 are supported by a drying nozzle arm 15. A humidity control mechanism 16 is provided to control the ambient humidity around the wafer W held by the spin chuck 3, i.e., the humidity of the atmosphere in the chamber 2 (processing space S). Each of the component parts in the substrate processing apparatus 1 is controlled according to the instructions of a control computer 17 as a control section having a CPU.

Figure 2:
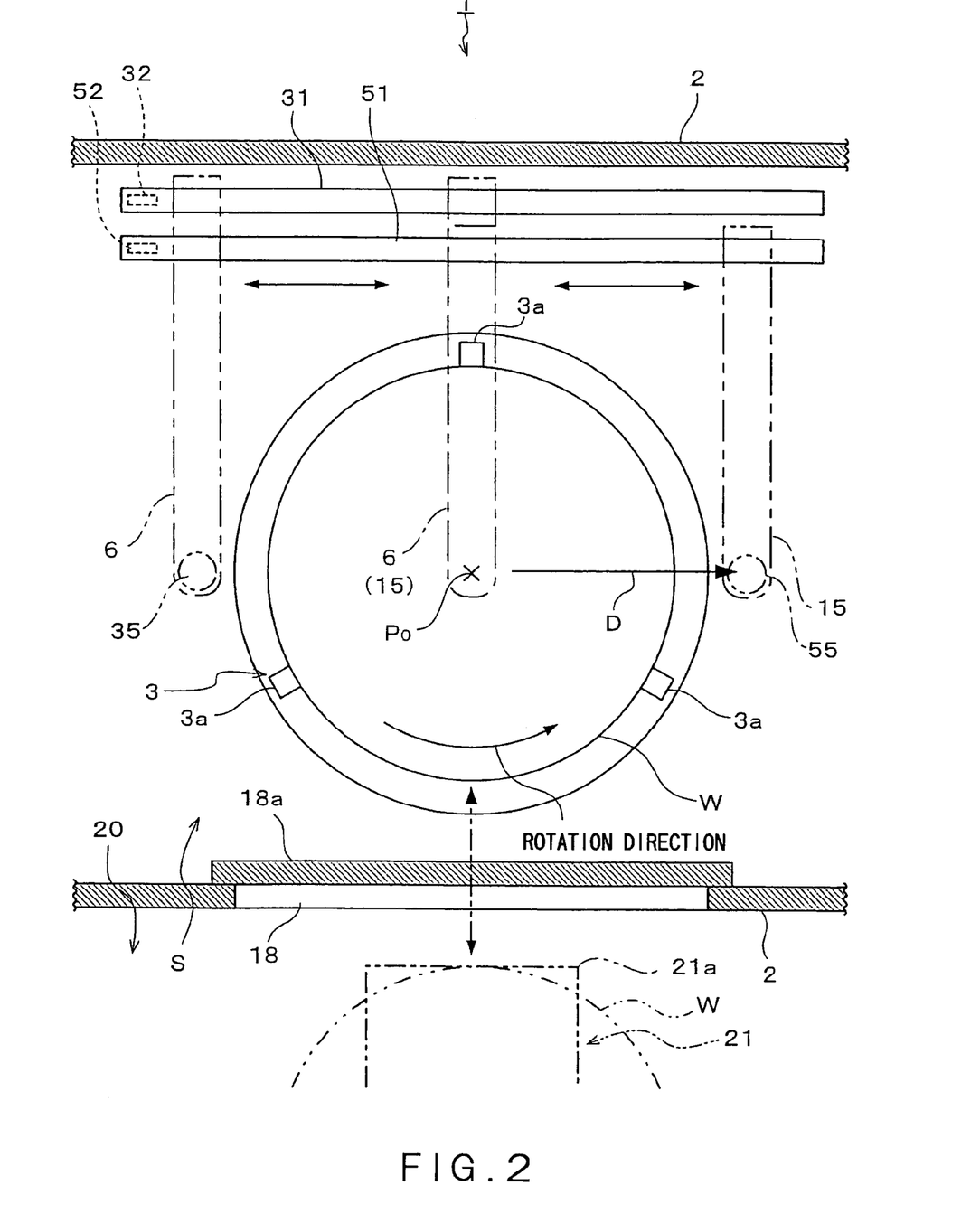
FIG. 2 is a schematic plan view showing the arrangement of component members in a processing space.

As shown in FIG. 2, provided in the chamber 2 are a loading and unloading port 18 for loading and unloading the wafer W into and out of the processing space S in the chamber 2, and a shutter 18a for opening and closing the loading and unloading port 18. By closing the loading and unloading port 18, the atmosphere surrounding the wafer W, that is, the processing space S can be put into a tightly closed state. The outside of the loading and unloading port 18 serves as a transport area 20 for transporting the wafer W, and a transport device 21 having a transfer arm 21a for holding and transporting wafers W one by one is disposed in the transport area 20. As shown in FIG. 1, an exhaust channel 24 for exhausting the processing space S is opened into the bottom of the chamber 2.

As shown in FIG. 1 and FIG. 2, the spin chuck 3 has three holding members 3a at the upper portion thereof so as to hold the wafer W substantially horizontally by abutting the holding members 3a at three positions respectively onto the peripheral edge of the wafer W. A motor 25 for rotating the spin chuck 3 about its rotation center axis extending substantially in the vertical direction is attached to the lower portion of the spin chuck 3. When the spin chuck 3 is rotated by driving the motor 25, the water W rotates substantially in a horizontal plane about the center Po of the wafer W as the rotation center integrally with the spin chuck 3. In the illustrated embodiment, the wafer W rotates in the counterclockwise (CCW) direction being observed as a plan view from above the wafer W. Driving of the motor 25 is controlled by the control computer 17.

The nozzle arm 6 is disposed above the wafer W supported on the spin chuck 3. The proximal end of the nozzle arm 6 is supported moveably along a guide rail 31 disposed substantially horizontally. A driving mechanism 32 is disposed for moving the nozzle arm 6 along the guide rail 31. By driving the driving mechanism 32, the nozzle arm 6 can move between a position above the wafer W supported by the spin chuck 3 and a position outside (left side in FIG. 1) the peripheral edge of the wafer W. Along with the movement of the nozzle arm 6, the nozzle 5 moves relatively to the wafer W from the position substantially above the center of the wafer W to a position above the peripheral edge thereof. Driving of the driving mechanism 32 is controlled by the control computer 17.

The nozzle 5 is attached to the lower end of an elevating shaft 36 protruding downward from an elevating mechanism 35 fixed to the lower surface of the top end of the nozzle arm 6. The elevating shaft 36 is capable of raising and lowering by the elevating mechanism 35, by which the nozzle 5 can be positioned at an optional height. Driving of the elevating mechanism 35 is controlled by the control computer 17.

A plurality of chemical liquid supply sources for supplying chemical liquids different from each other, for example, three chemical liquid supply sources 41, 42, and 43 are connected through respective chemical liquid supply channels 44, 45, and 46 to the nozzle 5. That is, a chemical liquid supply channel 44 connected to the chemical liquid (DHF solution) supply source 41 for supplying DHF solution, a chemical liquid supply channel 45 connected to the chemical liquid (SC-1 solution) supply source 42 for supplying SC-1 solution, a chemical liquid supply channel 46 connected to the chemical liquid (SC-2 solution) supply source 43 for supplying SC-2 solution are connected to the nozzle 5. Further, a rinse liquid supply channel 48 connected to a rinse liquid (DIW) supply source 47 for supplying DIW is connected to the nozzle 5. On-off valves 44a, 45a, 46a, and 48a are intervened to the chemical liquid supply channels, 44, 45, and 46 and the rinse liquid supply channel 48, respectively. The On-off operation of each of the on-off valves 44a, 45a, 46a, and 48a is controlled by the control computer 17.

The DHF solution supplied from the chemical liquid supply source 41 is a chemical liquid capable of removing a silicon oxide film ($SiO_2$) by etching, which is used as a cleaning chemical liquid for removing mainly native oxide films deposited on the wafer W. The SC-1 solution supplied from the chemical liquid supply source 42 is used as a cleaning chemical liquid for removing mainly organic contaminants and particles (deposited particles). The SC-2 solution is used as a cleaning chemical liquid for removing metal impurities, etc.

The drying nozzle arm 15 is disposed above the wafer W supported on the spin chuck 3. The proximal end of the drying nozzle arm 15 is moveably supported along a guide rail 51 disposed substantially horizontally. Further, a drying mechanism 52 is disposed for moving the drying nozzle arm 15 along the guide rail 51. By driving the driving mechanism 52, the drying nozzle arm 15 can move between a position above the wafer W and a position outside (right side in FIG. 1) of the peripheral edge of the wafer W. Along with the movement of the drying nozzle arm 15, the fluid nozzle 12 and the inert gas nozzle 13 move relative to the wafer W from a position above about the center of the wafer W toward a position above the peripheral edge thereof. Driving of the driving mechanism 52 is controlled by the control computer 17.

An elevating mechanism 55 having an elevating shaft 54 is fixed to the lower surface of the top end of the drying nozzle arm 15. The elevating shaft 54 is disposed so as to protrude downward from the elevating mechanism 55, and the fluid nozzle 12 and the inert gas nozzle 13 are attached to the lower end of the elevating shaft 54. The elevating shaft 54 expands or contracts being driven by the elevating mechanism 55, by which the fluid nozzle 12 and the inert gas nozzle 13 is raised and lowered integrally. Driving of the elevating mechanism 55 is controlled by the control computer 17. That is, according to the instructions from the control computer 17, driving of the driving mechanism 52 is controlled so that the drying nozzle arm 15, the fluid nozzle 12, and the inert gas nozzle 13 move in the horizontal direction, and the driving of the elevating mechanism 55 is controlled so that the height of the fluid nozzle 12 and the inert gas nozzle 13 is adjusted.

The fluid nozzle 12 and the inert gas nozzle 13 are disposed so as to line up above the wafer W along a straight line extending in the diametrical direction connecting the center of the wafer W and the rightmost end of the peripheral edge of the wafer W. Further, the inert gas nozzle 13 is disposed on the left side of the fluid nozzle 12 in FIG. 1. That is, when the fluid nozzle 12 moves along the moving direction D from the center Po to the right side of the peripheral edge of the wafer W in FIG. 1 by the movement of the drying nozzle arm 15, the inert gas nozzle 13 moves to follow the fluid nozzle 12 while being positioned behind the fluid nozzle 12 in the moving direction D, that is, being positioned between the center Po and the fluid nozzle 12 in a plan view.

A fluid supply channel 67 connected to a fluid supply source 66 such as a tank storing IPA liquid is connected to the fluid nozzle 12. An on-off valve 68 is intervened in the fluid supply channel 67. The on-off operation of the on-off valve 68 is controlled by the control computer 17.

An inert gas supply nozzle channel 72 connected to an inert gas ($N_2$) supply source 71 is connected to the inert gas nozzle 13. An on-off valve 73 is intervened in the inert gas supply channel 72. The on-off operation of the on-off valve 73 is controlled by the control computer 17.

Then, the humidity control mechanism 16 will be described. As shown in FIG. 1, the humidity control mechanism 16 has a gas supply chamber 91 for blowing clean air or CDA (Clean Dried Air (low dew point clean air)) as a humidity control gas (air) into a processing space S, and a humidity control gas supply line 92 for supplying a humidity control gas to the gas supply chamber 91. The humidity control mechanism 16 is controlled by the control computer 17.

Figure 3:
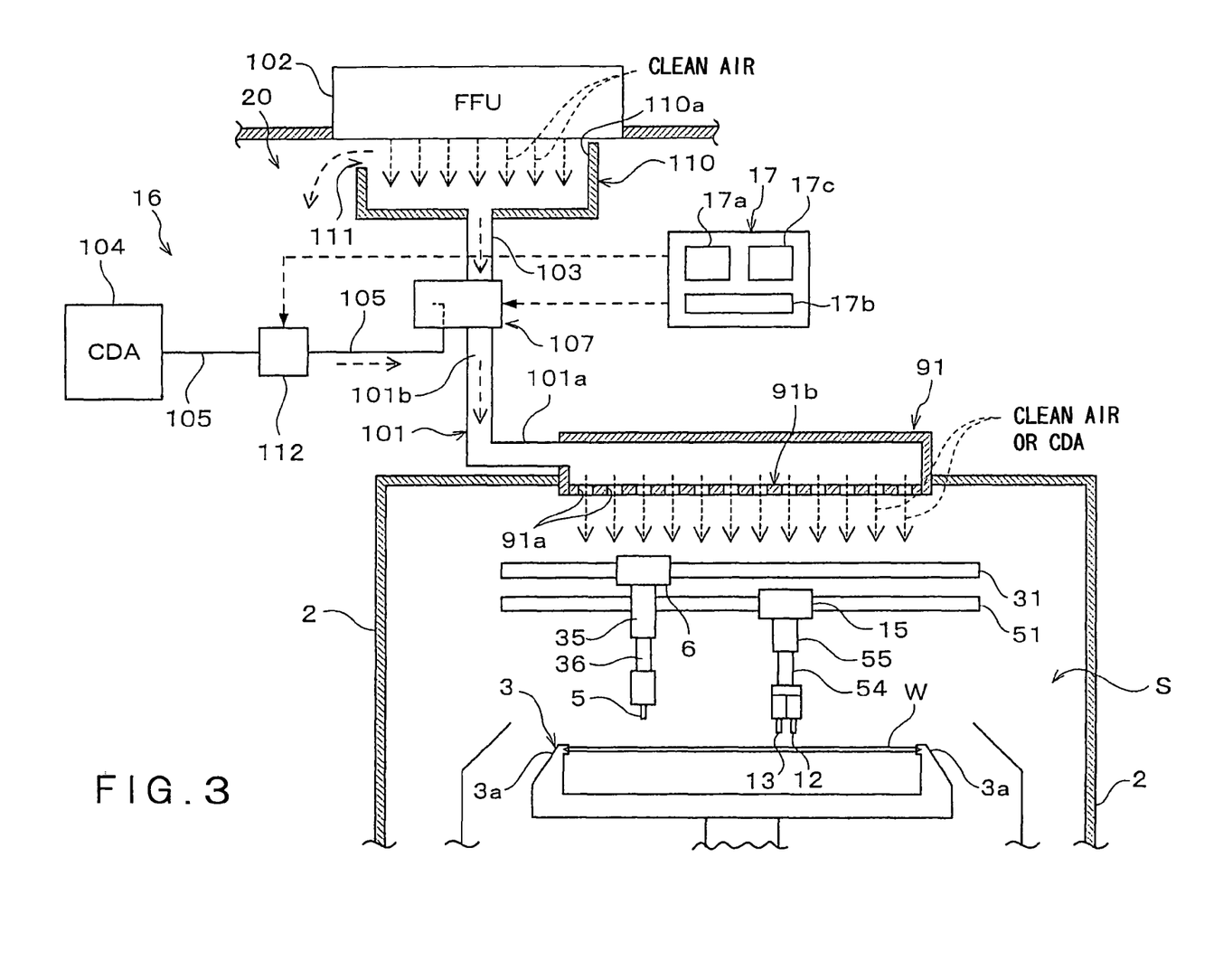
FIG. 3 is an explanatory view for explaining the constitution of a humidity control mechanism.

The gas supply chamber 91 is disposed at the ceiling portion of the chamber 2, that is, above the wafer W held by the spin chuck 3. As shown in FIG. 3, a plurality of gas discharge ports 91a for discharging a humidity control gas from the inside of the gas supply chamber 91 are formed in the lower surface of the gas supply chamber 91 to be to be distributed uniformly over the entire lower surface. That is, the plurality of gas discharge ports 91a are disposed so as to oppose uniformly against the entire upper surface of the wafer W held by the spin chuck 3, so that a rectified down flow of the humidity control gas is formed in the processing space S. As a lower plate 91b constituting the lower surface of the gas supply chamber 91, a punching plate (punching screen), that is, a plate apertured with a plurality of holes by press-punching may be used for instance, and the holes in the punching plate may be used as the gas discharge ports 91a.

The downstream end of the humidity control gas supply line 92 (i.e., a horizontal portion 101a of a main flow channel 101, described later) is connected to the sidewall of the gas supply chamber 91.

The humidity control gas supply line 92 is provided with: a main supply channel 101 for supplying the humidity control gas to the gas supply chamber 91 and introducing the same through the gas supply chamber 91 to the processing space S; an FFU (Fan Filter Unit: air cleaner) 102 as a humidity control gas supply source for supplying clean air; a clean air supply channel 103 for introducing the clean air supplied from FFU 102 to the main supply channel 101; a CDA supply source 104 as a humidity control gas supply source (low dew point gas supply source) for supplying CDA; and a CDA supply channel (low dew point gas supply channel) 105 for supplying CDA supplied from the CDA supply source 104 to the main supply channel 101. The upstream end of the main supply channel 101 and the downstream end of the clean air supply channel 103 are connected with each other by way of a switching damper 107 as a switching portion. The upstream end of the main supply 101 and the downstream end of the CDA supply channel 105 are also connected with each other by way of the switching damper 107.

The main supply channel 101 comprises, for example, an inner flow channel of a tubular duct, which is formed into a substantially L-shaped configuration having a horizontal portion 101a extending substantially in the horizontal direction and a vertical portion 101b extending substantially in the vertical direction. The top end of the horizontal portion 101a is opened to the sidewall of the gas supply chamber 91. The upper end of the vertical portion 101b is opened to the switching damper 107 (a lower surface of a casing 121, described later).

The FFU 102 is disposed outside above the chamber 2, for example, at a ceiling of the clean room in which the substrate processing apparatus 1 is installed, or at a ceiling of a processing system in which the substrate processing apparatus 1 is incorporated. In the illustrated embodiment, the FFU 102 is disposed to the ceiling of a transport area 20. Although not illustrated, a blower for sending air, a filter for cleaning the air into a clean air, etc. are disposed to the inside of the FFU 102. Further, a rectifier plate, a plurality of clean air discharged ports for discharging the clean air, etc. are disposed to the lower surface of the FFU 102, and a rectified clean air is discharged from the lower surface of the FFU 102 to form a down flow of the clean air.

An intake cup 110 for receiving the clean air supplied from the FFU 102 and taking the same into the clean air supply channel 103 is disposed below the FFU 102. The intake cup 110 has an upper end opening 110a and is disposed with the opening 110a being opposed to the lower surface of the FFU 102. The upstream end of the clean air supply channel 103 is connected to the lower surface of the intake cup 110. Further, a gap 111 serving as a clean air exhaust port for exhausting the clean air from the inside of the intake cup 110 is formed between the upper edge on one side wall of the intake cup 110 and the lower surface of the FFU 102.

The clean air supply channel 103 comprises, for example, an inner flow channel of a tubular duct, and extends substantially linearly in the vertical direction from the lower surface of the intake cup 110 downwardly. The downstream end of the clean air supply channel 103 is connected to the upper surface of a switching damper 107 (i.e., an upper surface of a casing 121, described later). The downstream end of the clean air supply channel 103 and the upstream end of the vertical portion 101b of the main supply channel 101 described above are disposed so as to oppose to each other with the inside of the switching damper 107 (i.e., a clean air supply channel connection chamber 123, describe later) being placed therebetween. The clean air supply channel 103 and the vertical portion 101b are disposed so as to substantially line up on a common vertical line.

For the CDA supply source 104, a reservoir storing therein CDA in a pressurized state may be used for instance. The CDA can be generated by purifying (removing) impurities such as organics, water, etc. in a pressurized air by using a purifier filled with an absorbent or a catalyst. The humidity of CDA is remarkably lower than that of usual air (atmospheric air) and the clean air supplied from the FFU 102. That is, the dew point temperature is lower than that of usual air and the clean air. The dew point temperature of the CDA supplied from the CDA supply source 104 is preferably about −40° C. or lower and, more preferably, from about −110° C. to about −120° C.

An on-off valve 112 is intervened in the CDA supply channel 105 for switching a state where the upstream side thereof (the supply source 104 side) and the downstream side (the switching damper 107 side) are communicated with each other and a state where they are shut-off from each other. The downstream end of the CDA supply channel 105 is connected to the switching damper 107. The on-off operation of the on-off valve 112 is controlled by the control computer 17.

Figure 4:
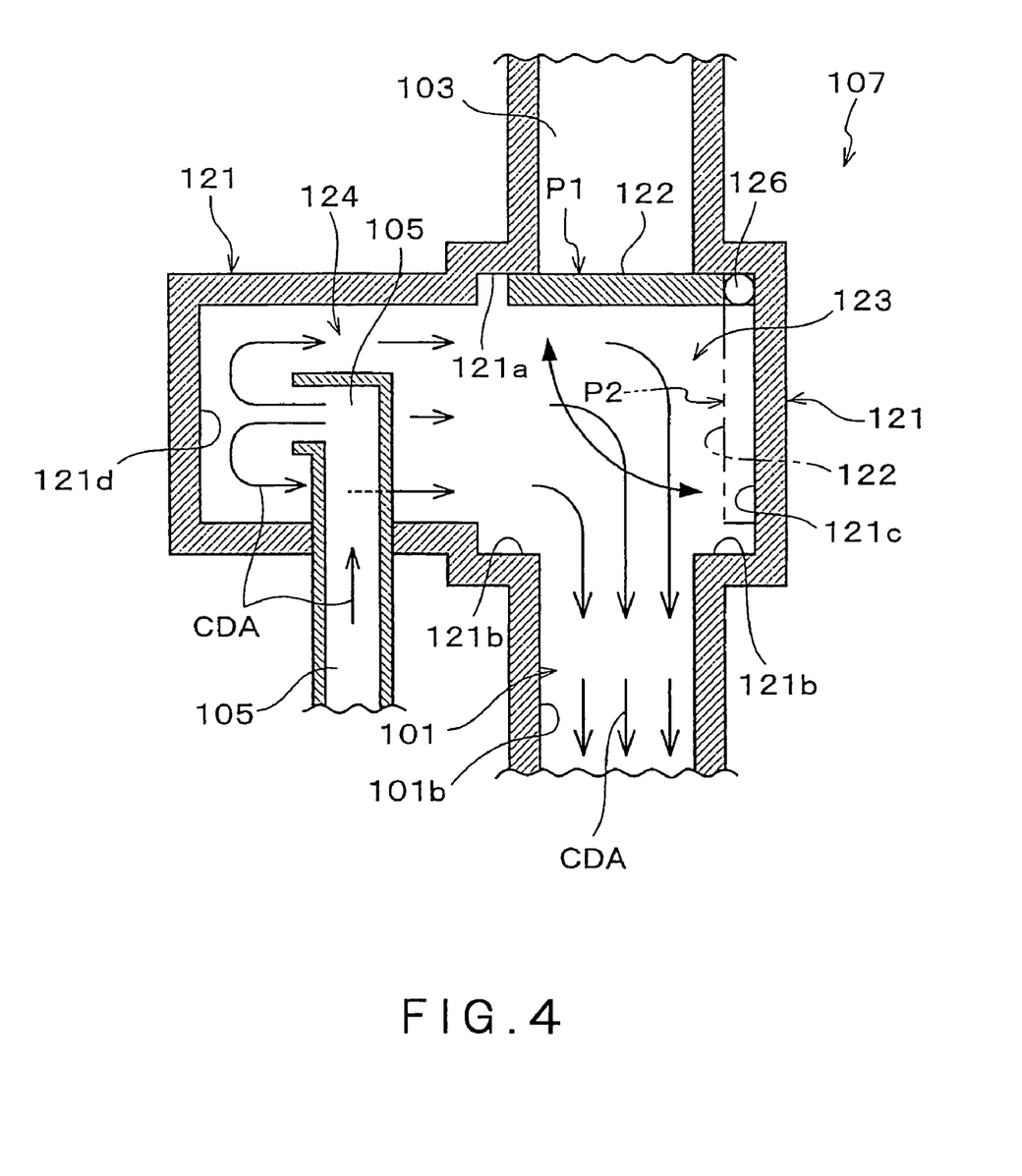
FIG. 4 is a schematic cross sectional view showing the constitution of a switching damper, and showing a state thereof where a clean air supply channel and a main supply channel are not communicated.
Figure 5:
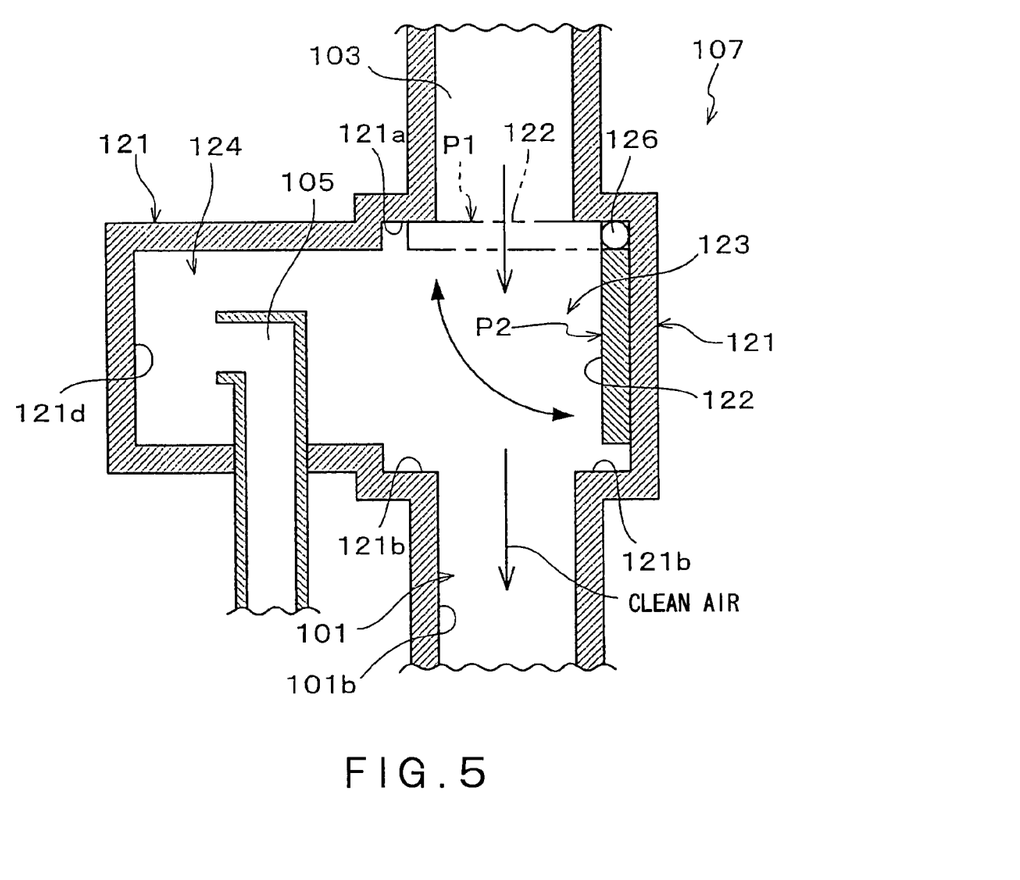
FIG. 5 is a schematic vertical cross sectional view explaining the state where the clean air supply channel and the main supply channel are communicated with each other.

As shown in FIG. 4 and FIG. 5, the switching damper 107 has a casing 121, and a movable member 122 of a substantially plate shape that opens and closes the downstream end opening of the clean air supply channel 103 in the casing 121.

The casing 121 is in a substantially cuboidal shape and has a clean air supply channel connection chamber 123 connected with the end of the clean air supply channel 103 and a CDA supply channel connection chamber 124 connected with the end of the CDA supply channel 105. The clean air supply channel connection chamber 123 and the CDA supply channel connection chamber 124 are arranged so as to be in adjacent with each other in the lateral direction and they are in communication with each other. In the illustrated embodiment, the right half (on the side of the inner lateral surface 121c of the casing 121) constitutes the clean air supply channel connection 123, and the remaining left half (on the side of the inner lateral surface 121d opposed to the inner surface 121c and the clean air supply channel connection chamber 123) constitutes the CDA supply channel connection chamber 124 in the space inside the casing 121.

In the portion corresponding to the clean air supply channel connection chamber 123, the lower end of the clean air supply channel 103 opens into the upper surface (ceiling surface) 121a of the casing 121, and the upstream end of the main supply channel 101 (vertical portion 101b) opens into the lower surface (bottom) 121b of the casing 121. That is, the end of the clean air supply channel 103 is disposed at a position above the end of the main supply channel 101 and opposed to the end of the main supply channel 101 with the clean air supply channel connection chamber 123 being placed therebetween; and the end of the clean air supply channel 103 is directed to the direction that allows the clean air to be discharged toward the end of the main supply channel 101.

The movable member 122 is disposed in the clean air supply channel connection chamber 123 and rotatably supported by the casing 121 via a rotation center shaft 126. The rotation center shaft 126 is disposed on the side of the upper surface 121a of the casing 121 in the clean air supply channel connection chamber 123 on the side of the end of the clean air supply channel 103 (i.e., on the side of the inner lateral side 121c) and supports the edge of the movable member 122. The movable member 122 rotates around the rotation center shaft 126 as the center of rotation, thereby capable of causing one lateral surface (upper surface) of the movable member 122 to approach and recede to and from the end of the clean air supply channel 103. Specifically, the movable member 122 is disposed laterally along the upper surface 121a, and can move to the close position P1 for closing the end of the clean air supply channel 103 by one lateral surface of the movable member 122 (FIG. 4) and an open position P2 receding from the end of the clean air supply channel 103 to open the end of the clean air supply channel 103 (FIG. 5). At the open position P2, the movable member 122 is disposed below the rotational central axis 126 in the vertical direction so as to be along the inner lateral surface 121c. The rotational operation of the movable member 122, that is, the operation of switching the clean air supply channel 103 between the communication state and the shutting-off state relative to the main supply channel 101 is controlled by the control computer 17.

The CDA supply channel connection chamber 124 is disposed on the side of the inner lateral surface 121d of the casing 121. The downstream end of the CDA supply channel 105 is inserted in the CDA supply connection chamber 124 so as to vertically penetrate the lower surface 121b of the casing 121. The downstream end of the CDA supply channel 105 is opened so as to oppose the inner lateral surface 121d and directed to the direction of discharging the CDA toward the inner lateral surface 121d. That is, in the inside of the switching dumber 107, the end of the CDA supply channel 105 is disposed at a position not opposing the end of the main supply channel 101 and directed to the direction of discharging the CDA toward the position different from the end of the main supply channel 101. With such a constitution, the flowing force of the CDA discharged from the end of the CDA supply channel 105 can be weakened as compared with a case of directing the end of the CDA supply channel 105 toward the clean air supply channel connection chamber 123 or a case of directing it so as to discharge the CDA toward the end of the main supply channel 101.

Then, the control computer 17 is to be described. As shown in FIG. 1, each of functional elements of the substrate processing apparatus 1 is connected by way of a signal line to the control computer 17 that automatically controls the entire operation of the substrate processing apparatus 1. The functional elements mean herein, for example, all the elements that operate for realizing predetermined processing conditions of the motor 25, the driving mechanism 32, the elevating mechanism 35, the driving mechanism 52, the elevating mechanism 55, the on-off valves 44a, 45a, 46a, 48a, 68, and 73, the switching damper 107, the on-off valve 112, etc. described above. The control computer 17 is typically a general-purpose computer capable of realizing optional function based on the software to be executed.

As shown in FIG. 1, the control computer 17 has an operation section 17a having a CPU (central processing unit), an input/output section 17b connected with the operation section 17a, and a storage medium 17c inserted into the input/output section 17b storing control software. Control software for causing the substrate processing apparatus 1 to conduct a predetermined substrate processing method to be described later by being executed by the control computer 17 is recorded in the storage medium 17c. By executing the control software, the control computer 17 controls each of the functional elements of the substrate processing apparatus 1 so as to attain various processing conditions defined by a predetermined process recipe (for example, number of rotation of the motor 25). The substrate processing method based on the control software includes a chemical liquid processing step, a rinsing step, an IPA liquid film forming step, and a drying step, as will be described specifically later, and the controls for carrying out the steps are conducted successively.

The storage medium 17c may be disposed fixedly to the control computer 17, or may be mounted detachably to a not illustrated reading device disposed to the control computer 17 and can be read by the reading device. In a most typical embodiment, the storage medium 17c is a hard disk drive to which control software is installed by a serviceman of a manufacturer of the substrate processing apparatus 1. In another embodiment, the storage medium 17c is a removable disk written with control software such as a CD-ROM or DVD-ROM. Such a removable disk is read by a not illustrated optical reading device disposed to the control computer 17. Further, the storage medium 17c may be either an RAM (random access memory) or ROM (read only memory). Furthermore, the storage medium 17c may be a cassette type ROM. In short, any of those known in the technical field of computers can be used as the storage medium 17c. In a factory where a plurality of substrate processing apparatus 1 are provided, the control software may be stored in a control computer for collectively controlling the control computer 17 for each of the substrate processing apparatus 1. In this case, each of the substrate processing apparatus 1 is operated by a control computer by way of a communication network to execute a predetermined process.

Then, description will be made to a method of processing a wafer W using the substrate processing apparatus 1 constituted as described above. The substrate processing apparatus 1 can conduct a plurality types of cleaning processes, for example, three types of cleaning processes, that is, a first cleaning process L1 using DHF solution, a second cleaning process L2 using SC-1 solution and a third cleaning process L3 using SC-2 solution, one of them being selected depending on an object to be removed. For example, in a case of removing native oxide films formed on the surface of the wafer W, the cleaning process L1 is conducted. In a case of removing organic contaminants or particles adhered to the surface of the wafer W, the cleaning process L2 is conducted. Further, in a case removing metal impurities deposited on the surface of the wafer W, the cleaning process L3 is conducted.

Before conducting a process to the wafer W in the substrate processing apparatus 1, the control computer 17 recognizes a cleaning process to be conducted among the cleaning processes L1, L2, and L3 with reference to the selected processing recipe. Further, the control computer 17 conducts control for controlling the humidity in the processing space S based on the cleaning process (L1, L2, L3), that is, based on the kinds of the chemical liquid to be supplied to the wafer W.

In the case of conducting the cleaning process L1, that is, in the case of using the DHF solution, IPA liquid is used after the chemical liquid processing step, as will be described specifically later. In this case, CDA is supplied from the gas supply chamber 91 to reduce the humidity in the processing space S. In the case of conducting the cleaning process L2, that is, in the case of using the SC-1 solution, IPA liquid is not used after the chemical liquid processing step as will be described later. In this case, a clean air is supplied from the gas supply chamber 91. Also in the case of conducting the cleaning process L3, that is, in the case of using the SC-2 solution, IPA liquid is not used after the chemical liquid processing step in the same manner as in the cleaning process L2. Also in this case, the clean air is supplied from the gas supply chamber 91. As described above, the control computer 17 supplies either the CDA or the clean air to the processing space 12 by operating the humidity control mechanism 16 based on the selection for the cleaning process L1, L2, or L3 to be conducted, that is, depending on the kind of the chemical liquid to be supplied to the wafer W (that is, more specifically, depending on whether or not the IPA liquid is used after the chemical liquid processing step or depending on the degree of hydrophobicity of the wafer W after the chemical liquid processing step).

At first, description will be made to a case of supplying CDA from the gas supply chamber 91. In this case, the movable member 122 of the switching damper 107 is placed at the close position P1 (refer to FIG. 4) and the on-off valve 112 is in an opened state according to control instructions from the control computer 17. That is, it is set to a state of shutting the FFU 102 and the clean air supply channel 103 from the main supply channel 101 by the movable member 122 and communicating the CDA supply source 104 and the CDA supply channel 105 to the main supply channel 101.

In such a state, CDA delivered from the CDA supply source 104 is introduced through the CDA supply channel 105 to the CDA supply channel connection chamber 124 of the switching damper 107. As shown in FIG. 4, in the CDA supply channel connection chamber 124, the CDA is discharged from the end of the CDA supply channel 105 toward the inner lateral surface 121d situated on the side opposed to the clean air supply connection chamber 123 in the lateral direction. Then, the direction of the flow of the CDA is reversed by collision against the inner lateral surface 121d, that is, so as to be directed toward the clean air supply channel connection chamber 123. Then, the CDA flows from the CDA supply channel connection chamber 124 toward the clean air supply channel connection chamber 123, flows into the end of the main supply channel 101 disposed to the lower portion of the clean air supply channel connection chamber 123 and is then introduced through the main supply channel 101 to the gas supply chamber 91. Then, it is rectified through a plurality of the gas discharge ports 91a and discharged therefrom downwardly. As described above, the CDA supplied from the CDA supply source 104 is introduced in the processing space S by passing through the CDA supply channel 105, the CDA supply channel connection chamber 124, the clean air supply channel connection chamber 123, the main supply channel 101, and the gas supply chamber 91 successively. The CDA thus supplied to the processing space S descends in the processing space S and is exhausted from the processing space S through the exhaust channel 24 disposed at the bottom of the chamber 2. Thus, since the processing space S is exhausted during supply of the CDA into the processing space S, the atmosphere in the processing space S is replaced with the CDA and the humidity in the processing space S is reduced (the dew point temperature is lowered). The dew point temperature of the atmosphere in the processing space S is lowered to the same dew point temperature as that of the CDA, for example, about −40° C. or lower, preferably, about from −110° C. to −120° C. Thereby, it is possible to reduce the amount of water to be taken into IPA in the IPA liquid film forming step of the cleaning process L1 or the drying step described later. Further, in the drying step described later, the drying performance for the wafer W can be improved. Usually, in the cleaning room where the substrate processing apparatus 1, etc. are installed, while the temperature is at a normal temperature (about 23° C.) and the relative humidity is about 40% to 45%, the humidity in the processing space S can be reduced to a level lower than the relative humidity in the clean room.

As described above, in the switching damper 107, since the CDA is once discharged from the end of the CDA supply channel 105 to the inner lateral surface 121d and, subsequently, reversed in the direction, the CDA can be introduced smoothly at an appropriate flow velocity into the clean air supply channel connection chamber 123. Further, in the clean air supply channel connection chamber 123, the CDA is introduced laterally from the CDA supply channel connection chamber 124 toward the clean air supply channel connection chamber 123, the flowing direction of the CDA is reversed from the lateral to the vertical direction in the clean air supply channel connection chamber 123, and then the CDA is introduced into the end opening of the main flow channel 101 below the chamber 123. Accordingly, the flow velocity of the CDA can be further lowered and the CDA can be introduced smoothly at an appropriate flow velocity into the end of the main supply charmer 101. Therefore, the CDA can be supplied smoothly at a stable flow rate to the processing space S and the atmosphere in the processing space S can be well replaced with the CDA.

Further, by laterally introducing the CDA into the gas supply chamber 91 from the side wall thereof, the CDA can be discharged uniformly through the respective gas discharge ports 91a after the CDA has been diffused over the whole interior of the gas supply chamber 91. That is, as compared with the case where the CDA is introduced from the ceiling of the gas supply chamber 91, the CDA can be diffused over the whole interior of the gas supply chamber 91 more effectively and discharged more uniformly from the respective gas discharge ports 91a. Accordingly, the CDA can be supplied into the whole processing space S, thereby ensuring reduction of the humidity in the processing space S with no unevenness.

The blower in the FFU 102 always operates irrespective that either the CDA or the clean air is supplied into the processing space S, and the clean air is always supplied from the FFU 102. As described above, in a case where the downstream end of the clean air supply channel 103 is closed by the movable member 122, the clean air supplied from the FFU 102 toward the intake cup 110 and the clean air supply channel 103 cannot flow into the clean air supply channel connection chamber 123, and is discharged through the gap 111 (refer to FIG. 3) to the outside of the intake cup 110 so as to overflow from the intake cup 110. With the constitution allowing the clean air in the intake cup 110 to be released through the gap 111 as described above, back flow of the clean air to the FFU 102 can be prevented even when the FFU 102 is continuously operated while the clean air is not supplied to the processing space S. This stabilizes the operation of the blower and prevents undesired effects on the FFU 102. In addition, the switching of the switching damper 107 is more rapid than the switching between the operation and the stopping of the FFU 102; and the operation efficiency of the FFU 102 is higher. Further, the clean air discharged through the gap 111 to the outside of the intake cup 110 may be introduced into the transport area 20.

Then, description will be made to a case of supplying a clean air from the gas supply chamber 91. In this case, the movable member 122 of the switching damper 107 is placed at the open position P2 (refer to FIG. 5) and the on-off valve 112 is put to a closed state according to control instructions from the control computer 17. That is, the FFU 102 and the clean air supply channel 103 are in communication with the main supply channel 101, and the CDA supply source 104 and the CDA supply channel 105 are shut-off from the main supply channel 101.

In the state described above, the clean air delivered from the FFU 102 flows through the opening portion 110a into the intake cup 110 and is then introduced from the intake cup 110 through the clean air supply channel 103 to the clean air supply channel connection chamber 123 of the switching damper 107. Then, the clean air is introduced from the clean air supply channel connection chamber 123 through the main supply channel 101 to the gas supply chamber 91. Then, the clean air is rectified through the plural gas discharge ports 91a and discharged therefrom downwardly. As described above, the clean air supplied from the FFU 102 successively passes through the intake cup 110, the clean air supply channel 103, the clean air supply channel connection chamber 123, the main supply channel 101 and the gas supply chamber 91, and then is introduced into the processing space S. The clean air supplied into the processing space S descends in the processing space S and is then exhausted by the exhaust channel 24 from the processing space S. As described above, since the exhaustion is conducted while supplying the clean air into the processing space S, atmosphere in the processing space S is replaced with the clear air. In this case, the dew point temperature of the atmosphere in the processing space S is, for example, substantially identical with that in the clean room.

In a state where the movable member 122 is placed at the open position P2, the movable member 122 retracts from a space between the end of the clean air supply channel 103 and the end of the main supply channel 101, and thus disturbance of the flow of the clean air from the end of the clean air supply channel 103 to the end of the main channel 101 by the movable member 122 can be prevented. Further, since the clean air supply channel 103, the clean air supply channel connection chamber 123, and the vertical portion 101b of the main supply channel 101 are substantially line up on a common straight line, the clean air supplied in a rectified state from the FFU 102 can descend smoothly along the substantially vertical direction successively through the intake cup 110, the clean air supply channel 103, the clean air supply channel connection chamber 123, and the vertical portion 101b of the main flow channel 101. Accordingly, disturbance of the flow of the clean air rectified in the FFU 102 can be prevented and the clean air can be introduced smoothly to the main supply channel 101 and supplied at a stable flow rate to the processing space S. Accordingly, the atmosphere in the processing space S can be well replaced with the clean air.

Further, by laterally introducing the clean air into the gas supply chamber 91 from the side wall thereof, the clean air can be discharged uniformly through the respective gas discharge ports 91a after the clean air has been diffused over the whole interior of the gas supply chamber 91. That is, as compared with the case where the clean air is introduced from the ceiling of the gas supply chamber 91, the clean air can be diffused over the whole interior of the gas supply chamber 91 more effectively and discharged more uniformly from the respective gas discharge ports 91a. Accordingly, the clean air can be supplied into the whole processing space S, thereby reliably replacing the atmosphere in the processing space S with the clean air.

Note that a configuration, in which most of the clean air supplied from the FFU 102 to the intake cup 110 is introduced from the inside of the intake cup 110 into the clean air supply channel 103 while the remaining portion of the clean air is discharged through the gap 111 to the outside of the intake cup 110, is possible. For example, about 80% of the flow rate of the clean air supplied form the FFU 102 may be introduced from the inside of the intake cup 110 into the clean air supply channel 103, and the other about 20% may be discharged to the outside of the intake cup 110.

Then, description will be made to the cleaning process L1 in which the chemical liquid supplied to the wafer W is the DHF solution. At first, the loading and unloading port 18 is opened, a wafer W not yet cleaned is loaded by the transfer arm 21a of the transfer mechanism 21 into the processing space S where the humidity is controlled (reduced) by the supply of CDA as described above, and the wafer W is transferred to the spin chuck 3 as shown in FIG. 1. For the transfer of the wafer W to the spin chuck 3, the nozzle arm 6 and the drying nozzle arm 15 are retracted to the stand-by positions situated to the right and the left of the spin chuck 3 respectively as shown by double-dotted chain lines in FIG. 2.

When the wafer W is transferred to the spin chuck 3, the transfer arm 21a is retracted from the processing space S, the loading and unloading port 18 is closed by the shutter 18a, the spin chuck and the wafer W start to rotate by the driving of the motor 25, and the chemical liquid (DHF solution) processing step is started. At first, the nozzle arm 6 is moved to a position above the wafer W (dotted chain in FIG. 2), and the nozzle 5 is disposed above the center Po of the wafer W. Then, while closing the on-off valves 45a, 46a, and 48a, the on-off valve 44a is opened, the DHF solution is sent to the chemical liquid supply channel 44 and the DHF solution is supplied from the nozzle 5 to the center Po for the rotating wafer W. The DHF solution supplied to the center Po is diffused over the entire upper surface of the wafer W by centrifugal force. Thus, a liquid film of the DHF solution is formed on the upper surface of the wafer W. The number of rotation of the wafer W during supply of the DHF solution may be set, for example, to about 500 rpm. After forming the liquid film of the DHF solution, supply of the DHF solution from the nozzle 5 is stopped and the upper surface of the wafer W is processed by the liquid film of the DHF solution for a predetermined time. Alternatively, the processing may be performed while continuing the supply of the DHF solution and the rotation of the wafer W. When the DHF solution processing is conducted, the degree of hydrophobicity of the upper surface of the wafer W is increased to be higher than that before the processing with the DHF solution.

After completion of the DHF solution processing, a rinsing step is conducted. In the rinsing step, deionized water is supplied toward the center Po of the wafer W from the nozzle 5 while rotating the wafer W. The deionized water supplied to the center Po is diffused over the entire upper surface of the wafer W by centrifugal force. The DHF solution adhered to the upper surface of the wafer W is flushed away from the wafer W by the deionized water. The number of rotation of the wafer W during rinsing is preferably higher than that during supply of the DHF solution, and it may be set, for example, to about 1,000 rpm. After the wafer W has been rinsed sufficiently by the deionized water, the supply of the deionized water from the nozzle 5 is stopped, and the nozzle arm 6 is retracted from the position above the wafer W and returned to the stand-by position.

Figure 6:
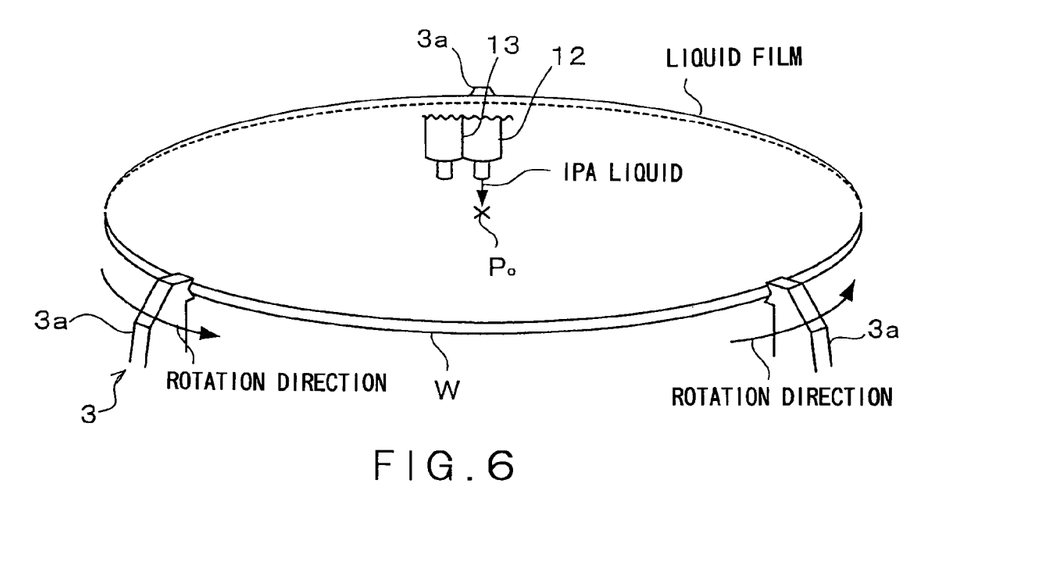
FIG. 6 is a schematic perspective view for explaining the operation of a fluid nozzle in an IPA liquid film forming step.

After the rinsing step described above, an IPA liquid film forming step of forming a liquid film of IPA liquid to the wafer W is conducted. At first, the drying nozzle arm 15 is moved to a position above the wafer W (shown by dotted chain lines in FIG. 2), and the fluid nozzle 12 is arranged above the center Po of the wafer W. Then, as shown in FIG. 6, while rotating the wafer W by the spin chuck 3, the IPA liquid is supplied from the fluid nozzle 12 to the center Po of the wafer W. The IPA liquid supplied to the center Po is diffused over the whole surface of the wafer W by centrifugal force, so that the IPA liquid in a form of a liquid film coats the whole upper surface of the wafer W. The number of rotation of the wafer W in the IPA liquid film forming step is preferably lower than that in the rinsing and it may be set, for example, to about 300 rpm.

By forming the liquid film of the IPA liquid on the upper surface of the wafer W as described above, the pure wafer can be replaced with IPA over the entire upper surface of the wafer W. Further, by covering the upper surface of the wafer W with the liquid film of the IPA liquid, natural drying of the upper surface, particularly, the peripheral portion of the upper surface of the wafer W can be prevented. This can prevent generation of particles or water marks on the upper surface of the wafer W. In particular, even though the hydrophobicity of the upper surface of the wafer W is increased by the chemical liquid processing with the DHF solution, generation of particles can be prevented effectively. Even in a wafer W of a large diameter, generation of particles near the peripheral edge of the wafer W (streak-like water marks, etc. formed by the deposition of chemical liquid, etc.) can be suppressed.

Figure 7:
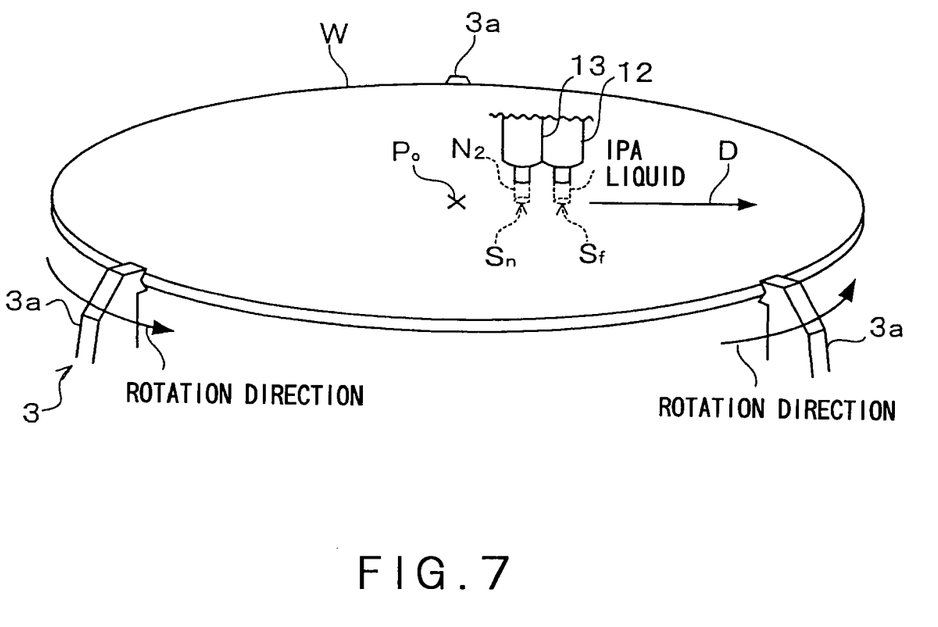
FIG. 7 is a schematic perspective view for explaining the operation of a fluid nozzle and an inert gas nozzle in a drying step.

After forming the liquid film of the IPA liquid to the upper surface of the wafer W as described above, a drying step of supplying the IPA liquid and a nitrogen gas to the wafer W to conduct a drying processing step that dries the wafer W. At first, in a state of arranging the fluid nozzle 12 and the inert gas nozzle 13 near a portion above the center Po of the wafer W, supply of the IPA liquid from the fluid nozzle 12 and supply of the nitrogen gas from the inert gas nozzle 13 are started. Then, while rotating the wafer W by the spin chuck 3, the drying nozzle arm 15 is moved while supplying the IPA liquid and the nitrogen gas. Thus, the fluid nozzle 12 and the inert gas nozzle 13 move integrally with the drying nozzle arm 15 in the moving direction D, in which the supply position Sf for the IPA liquid from the fluid nozzle 12 and the supply position Sn for the nitrogen gas from the inert gas nozzle 13 at the upper surface of the wafer move along the moving direction D so as to scan from the center Po to the peripheral edge of the wafer W as shown in FIG. 7. As described above, by moving the supply position Sf for the IPA liquid and the supply position Sn for the nitrogen gas at least from the center Po to the peripheral edge of the wafer W while rotating the wafer W, the IPA solution and the nitrogen gas are supplied over the entire upper surface of the wafer W.

The IPA liquid supplied to the upper surface of the rotating wafer W flows toward the outer periphery of the wafer W by centrifugal force. Further, during movement of the supply position Sf for the IPA liquid from the side of the center Po to the periphery of the wafer W, the nitrogen gas supplied from the inert gas nozzle 13 is supplied to the supply position Sn which is adjacent to the supply position Sf for the IPA liquid and is always located nearer to the center Po of the wafer W than the supply position Sf. Further, the supply position Sn for the nitrogen gas moves from the side of the center Po to the side of the peripheral edge to follow the supply position Sf, while the supply position Sn is located between the center Po and the supply position Sf. The number of rotation of the wafer W in the drying step may be set, for example, within a range of about 500 rpm to 800 rpm. Further, the moving speed of the supply position Sf for the IPA solution and the supply position Sn for the nitrogen gas in the moving direction D may be set, for example, to about 150 mm/sec.

As described above, by supplying the nitrogen gas to the supply position Sn adjacent to the supply position Sf on the side of the center Po, the IPA liquid supplied to the upper surface of the wafer W is immediately forced to flow by the nitrogen gas, promoting drying of the wafer W. Further, the upper surface of the wafer W can be dried uniformly and efficiently. Further, since the oxygen concentration affecting the generation of the wafer marks can be lowered, generation of water marks can be prevented. Further, generation of particles caused by the difference of the volatility between IPA and deionized water can be prevented, improving the quality of the wafer W.

When the supply position Sf for the IPA liquid is moved to the peripheral edge of the wafer W, supply of the IPA liquid from the fluid nozzle 12 is stopped. Then, after moving the supply position Sn of the nitrogen gas to the peripheral edge of the wafer W, supply of the nitrogen gas from the inert gas nozzle 13 is stopped. Thus, the drying step is completed.

After the drying step, the rotation of the spin chuck 3 is stopped to stay the wafer W stationary, and the loading and unloading port 18 is opened. The transfer arm 21*a* intrudes into the chamber 2, receives the wafer W from the spin chuck 3 and delivers the same out of the chamber 2. Thus, a series of process steps for the wafer W in the substrate processing apparatus 1 is completed.

As described above, the CDA is always supplied from the gas supply chamber 91 to the processing space S during chemical liquid processing step, the rinsing step, the IPA liquid film forming step and the drying step so as to maintain the state in which the humidity in the processing space S is reduced (dew point temperature about −40° C. or lower). Thus, by reducing the humidity in the atmosphere surrounding the wafer W, dissolving of moisture existing in the processing space S into the IPA solution supplied on the wafer W can be prevented, particularly when conducting the IPA liquid film forming step and the drying step. This can prevent generation of particles on the wafer W after drying. Further, in the drying step, drying for the wafer W can be promoted.

According to the study of the inventors, it was found that, in a case where a wafer W is in a highly hydrophobic state (i.e., in a state where a hydrophobic layer is exposed in abundance, particularly, in a state where the silicon oxide film is removed) after chemical liquid processing, water marks are likely to be formed on the wafer W in the subsequent drying step, if the wafer W is dried by using a conventional drying method that, for example, rotates the wafer W to spin off the liquid, or supplies a drying gas such as a nitrogen gas to the wafer W. On the contrary, it was found that, in a case where the wafer W is in a less hydrophobic state after the chemical liquid processing (in a state where the hydrophobic layer is exposed slightly or in a state where hydrophilic surface is present in abundance) after the chemical liquid processing as in the cleaning process L2 and L3 described later, water marks are not likely to be formed on the wafer W in the subsequent drying step even if the wafer is dried by the conventional drying method.

Then, description will be made to the cleaning process L2 in which the chemical liquid supplied to the wafer W is SC-1 solution. In the cleaning process L2, a chemical liquid (SC-1 solution) processing step, a rinsing step using deionized water and a drying step of drying the wafer W are conducted. In such a chemical liquid processing step, when the SC-1 solution is supplied to the wafer W, the hydrophobicity of the wafer W is not increased unlike in the case of supplying the DHF solution, and the problem of generating particles and water marks, which is likely to occur in the case of using the DHF solution, is not likely to occur. Further, the IPA liquid film forming step can be omitted. Further, in the drying step, it is not necessary to supply the IPA solution, and the rinse liquid may be spun off by rotating the wafer W to dry the wafer W, or drying of the wafer W may be promoted by supplying nitrogen gas. As described above, in the case where the chemical liquid to be supplied to the wafer W is the SC-1 solution, the hydrophobicity of the wafer W is low, the process can be conducted without using IPA liquid and there is no possibility of generating particles or water marks to the wafer W after drying step even when the humidity in the processing space S is not reduced. That is, clear air that can be supplied at a lower cost than the CDA can be used.

Then, description will be made to the cleaning process L3 in which the chemical liquid supplied to the wafer W is SC-2 solution. In the cleaning process L3, a chemical liquid (SC-2 solution) processing step, a rinsing step using deionized water and a drying step of drying the wafer W are conducted. In such a chemical liquid processing step, when the SC-2 solution is supplied to the wafer W, the hydrophobicity of the wafer W is not increased unlike in the case of supplying the DHF solution, and the problem of generating particles and water marks, which is likely to occur in the case of using the DHF solution, is not likely to occur. Further, the IPA liquid film forming step may be omitted also in the cleaning process L3, as in the cleaning process L2. Further, in the drying step, it is not necessary to supply the IPA solution, and the rinse liquid may be spun off by rotating the wafer W to dry the wafer W, or drying of the wafer W may be promoted by supplying nitrogen gas. As described above, also in the case where the chemical liquid to be supplied to the wafer W is the SC-2 solution, the process can be conducted without using IPA liquid and there is no possibility of generating particles or water marks to the wafer W after drying step even when the humidity in the processing space S is not reduced as in the case where the solution supplied to the wafer W is the SC-1 solution. That is, clear air that can be supplied at a lower cost than the CDA can be used.

With the foregoing substrate processing apparatus 1, the ambient humidity around the wafer W is controlled depending on the kind of the chemical liquid to be supplied to the wafer W, and thus the humidity is reduced only when it is necessary, that is, only in the case of conducting the cleaning process L1 in which the IPA solution is supplied to the wafer W. That is, in the cleaning process L2 and L3 not supplying the IPA solution, a relatively inexpensive clean air, etc. supplied from the FFU 102 can be used so that the supply amount of the CDA can be reduced. This can reduce the cost necessary for the wafer processing. Further, by reducing the ambient humidity of the wafer W when it is necessary, generation of particles (water marks) to the wafer W after the cleaning process can be prevented.

One preferred embodiment of the present invention has been described, but the present invention is not restricted to the foregoing. It will be apparent to those skilled in the art that various variations or modifications within the range of the technical concept described in the claims are possible, and they should be included within the scope of the present invention.

For example, in the foregoing embodiment, the atmospheric humidity in the processing space S is controlled at two levels, one being the humidity of the clean air supplied from the FFU 102, and the other being the humidity of the CDA supplied from the CDA supply source 104. However, the humidity in the processing space S may be controlled in three or more levels, or controlled at optional values. For example, the mixing ratio between the clean air and the CDA may be changed by controlling the tilting angle of the movable member 122 of the switching damper 107 to control the degree of opening of the end of the clean air supply channel 103 thereby controlling the humidity of the humidity controlling gas introduced into the processing space S.

Further, the humidity control mechanism 16 is not restricted to the constitution as shown in the foregoing embodiment in which the humidity is controlled by using the clean air supplied from the FFU 102 and the CDA supplied from the CDA supply source 104. The humidity control mechanism 16 may be constituted so as to have a moisture adjusting unit capable of controlling the moisture content in the moisture controlling gas to an optional value, or a dehumidifier for dehumidifying the humidity controlling gas. In this case, the humidity in the processing space S can be controlled to an optional value by introducing the humidity controlling gas whose moisture content is adjusted into the processing space S and replacing the atmosphere in the processing space S therewith.

Further, the gas used as the moisture controlling gas is not restricted to air (clean air, CDA). Other gases may be used instead of the clean air; and other low dew point gas may be used instead of the CDA. The moisture controlling gas may also be an inert gas such as nitrogen gas. For example, a cleaned inert gas (having a usual dew point temperature) and a cleaned inert gas of a low dew point temperature may be supplied selectively as the humidity controlling gas. Further, although gases (clean air, CDA) of an identical kind and of different dew point temperatures are used as the humidity controlling gas in the foregoing embodiment, gases of different kinds and having different dew point temperatures may also be used as the humidity controlling gas. For example, the clean air supplied from the FFU may be used as the first humidity controlling gas, and a nitrogen gas of a low dew point temperature may be used, instead of the CDA, as a second humidity controlling gas.

In the foregoing embodiment, when conducting the cleaning process L1, the humidity in the processing space S is lowered before loading the wafer W into the processing space S, and the lowered humidity in the processing space S is maintained during conduction of the cleaning process L1. However, the lowered humidity in the processing space may be established at least in the step(s) of supplying the IPA solution, that is, only in the IPA liquid film forming step and the drying step. That is, lowering of the humidity in the processing space S is not necessary in the chemical liquid processing step and the rinsing step. However, it takes some time to adjust the humidity in the processing space S to a desired value, that is, to replace the atmosphere in the processing space S with CDA. Accordingly, it is preferable that the supply of CDA is started before starting the IPA liquid film forming step or the drying step, so that the humidity in the processing space S has been lowered to a desired value when the IPA liquid forming step or the drying step is conducted. Humidity control performed during the foregoing series of process steps applied to the wafer W (switching between the clean air supply and the CDA supply) is conducted by control instructions from the control computer 17.

The fluid containing IPA supplied in the IPA liquid film forming step and the drying step in the cleaning process L1 may be in a form of a mist, a spray or a gas, as well as a liquid. For example, mist of IPA liquid, mist of an IPA solution, IPA vapor or vapor of a diluted IPA solution may be used as the fluid containing IPA. Further, mist of IPA solution, mist of the IPA solution, IPA vapor, or vapor of a diluted IPA solution mixed with a gas such as nitrogen gas may also be used as the fluid containing IPA. When such a fluid containing IPA is used, intrusion of moisture content to IPA can be prevented by lowering the humidity in the processing space S. As the nozzle for supplying the fluid containing IPA, a two-fluid nozzle may also be used.

Further, the fluid containing IPA supplied in the IPA liquid film forming step and the fluid containing IPA supplied in the drying step may be in different states (phases). For example, a liquid such as IPA liquid may be used in the IPA liquid film forming step, while a gas such as IPA vapor or mist of IPA may be used in the drying step.

The gas supplied as the drying gas in the drying step is not restricted to nitrogen but may be other inert gases. Further, such drying gas is not restricted to the inert gas but may be, for example, air. Also in this case, the IPA liquid, etc. supplied to the upper surface of the wafer W can be flushed away to promote the drying of the wafer W. Further, the drying gas may be a gas in a dried state, that is, a gas whose humidity is forcibly lowered from the usual value and, it may be, for example, a dry air. Then, the humidity near the surface of the wafer W can be lowered to promote evaporation of the liquid such as the IPA liquid attached to the wafer W and drying of the wafer W can be promoted more effectively.

The kind of the chemical liquid that can be supplied to the wafer W in the substrate processing apparatus 1 is not restricted to the three kinds, i.e., DHF, SC-1, and SC-2, but may be chemical liquids of other kinds, or two or less or four or more kinds of liquid chemicals may be supplied. Further, the kind of the chemical liquid is not restricted to those for cleaning the wafer W but it may be an etching chemical liquid, for example, HF (hydrogen fluoride). For instance, a series of process steps for etching, including, for example, a rinsing step and a drying step can be conducted by supplying the wafer W with the etching chemical liquid such as HF (hydrogen fluoride) instead of the chemical liquid processing step in the cleaning process L1.

That is, the processing conducted in the substrate processing apparatus 1 is not restricted to three types of cleaning processes L1, L2 and L3 but the embodiment can be applied to various processes. For example, this can be applied also to an etching process, a resist removing process and a process for removing etching residues. Further, while deionized water is exemplified as a rinse liquid in this embodiment, the rinse liquid is not restricted to the same.

Further, plural types of chemical liquid processing steps for processing the wafer W by using chemical liquids of different kinds may be conducted successively in the processing space S. In the case of using the plural kinds of chemical liquids described above, if the plural kinds of chemical liquids contain a chemical liquid, for such as DHF solution or HF solution having a property of increasing the hydrophobicity of the wafer W, the humidity of the processing space S may preferably be lowered, at least in the drying step after processing the wafer W by using the DHF solution or HF solution, to a value less than that in the step conducted before the chemical liquid processing step using the DHF solution or the HF solution, that is, a chemical liquid processing step that processes the wafer W by using a chemical liquid other than the DHF solution and the HF solution, and less than that in the rinsing step. That is, when the hydrophobicity of the wafer W is increased by supplying the DHF solution or the HF solution, the humidity in the processing space S is preferably lowered to a value less than that in the state where the hydrophobicity of the wafer W is low before supplying the DHF solution or HF solution.

For example, after loading the wafer W into the substrate processing apparatus 1, the method may conduct at first a first chemical liquid processing step of supplying, for example, the SC-1 solution as the first chemical liquid different from DHF solution or HF solution thereby processing the wafer W; then conduct a first ringing step of rinsing the wafer W by supplying, for example, deionized water as the rinse liquid; successively, conduct the second chemical liquid processing step of supplying, for example, a chemical liquid having a property of increasing the hydrophobicity of the wafer W such as DHF solution thereby processing the wafer W; further conduct a second rinsing step of rinsing the after W by supplying, for example, deionized water as the rinse liquid; and then conduct a drying step of drying the wafer W. In the drying step, drying treatment utilizing the IPA solution may also be conducted like in the drying step conducted in the cleaning process L1. According to the fourth cleaning process L4 including the first chemical processing step and the second chemical liquid processing step, organic contaminants and particles can be removed by using the SC-1 solution, and spontaneous oxide films can be removed by using the DHF solution.

In the cleaning process L4, the processing space S may be put to a state of reduced humidity (state of being supplied with a low dew point gas) at least only in the step(s) conducted after the second chemical liquid processing step using the DHF solution, that is, in the IPA liquid film forming step and the drying step. As described above, also in the case of conducting plural types of chemical liquid processing steps continuously in the processing space S, the amount of the low dew point gas to be supplied can be remarkably reduced by supplying the low dew point gas only when it is necessary to lower the humidity. Further, also the control in the case of conducting a series of cleaning processes L4 including plural chemical liquid processing steps is conducted by the control computer 17, and the humidity control in the cleaning process L4 (switching between the clean air supply and the CDA supply) is also conducted by control instructions from the control computer 17.

Further, in the foregoing embodiment, although the substrate processing apparatus 1 is of a single wafer (substrate) processing type that processes wafers W one by one while a single wafer is held by a spin chuck 3, this embodiment can be applied also to a batch type processing apparatus that collectively processes a plurality of wafers W. Further, the substrate is not restricted to a semiconductor wafer but may be a glass for a LCD substrate, a CD substrate, a printed circuit board and a ceramic substrate.

The invention claimed is:

1. A substrate processing method that processes substrates, wherein said method employs a common substrate processing apparatus having a function of supplying a substrate with a plurality of kinds of chemical liquids, said substrate processing method comprising:

processing a substrate with a chemical liquid selected from the plurality of kinds of chemical liquids in the substrate processing apparatus; and drying a substrate, having been processed with the selected chemical liquid, wherein in a case where the processing of the substrate with the selected chemical liquid does not result in increasing of hydrophobicity of the substrate, the drying of the substrate is performed with a first gas being supplied into a processing space around the substrate thereby establishing an atmosphere in the processing space having a first humidity, while in a case where the processing of the substrate with the selected chemical liquid results in increasing of the hydrophobicity of the substrate, the drying of the substrate is performed with a second gas being supplied into the processing space around the substrate thereby establishing an atmosphere in the processing space having a second humidity, and wherein the second humidity is lower than the first humidity.

2. The substrate processing method according to claim 1, wherein the selected chemical liquid that causes increasing of hydrophobicity of the substrate is DHF (diluted hydrofluoric acid solution) or HF (hydrofluoric acid solution), and the selected chemical liquid that does not cause increasing of hydrophobicity of the substrate is SC-1 solution or SC-2 solution.

3. A substrate processing method comprising:
a first chemical liquid processing step that processes the substrate with a first chemical liquid with a first gas being supplied into a processing space around the substrate thereby establishing an atmosphere in the processing space having a first humidity;
a rinsing step that rinses the substrate after the first chemical liquid processing step;
a second chemical liquid processing step that processes the substrate with a second chemical liquid after the rinsing step; and
a drying step that dries the substrate after the second chemical liquid processing step, with an IPA-containing fluid being supplied onto the substrate, and with a second gas being supplied into a space around the substrate thereby establishing an atmosphere in the processing space having a second humidity lower than the first humidity;
wherein the processing of the substrate with a first chemical liquid does not result in increasing of hydrophobicity of the substrate, and the processing of the substrate with the second chemical liquid results in increasing of hydrophobicity of the substrate, and wherein the first chemical liquid processing step, the rinsing step, the second chemical liquid processing step and the drying step are performed with the substrate being held and rotated by a common spin chuck.

4. The substrate processing method according to claim 1, wherein the secondary humidity is specified by a dew point temperature −40° C. or lower.

5. The substrate processing method according to claim 1, wherein the first gas is a clean air supplied from a fan filter unit, and the second gas is clean dry air or nitrogen gas.

6. A storage medium storing software capable of being executed by a control computer of a substrate processing apparatus for performing a chemical liquid process and a drying process to a substrate,
wherein the software is configured to cause the substrate processing apparatus to perform the substrate processing method according to claim 1 or 3 when the software is executed by the control computer.

7. The substrate processing method according to claim 3, wherein the second chemical liquid comprises DHF (diluted hydrofluoric acid solution) or HF (hydrofluoric acid solution).

8. The substrate processing method according to claim 3, wherein the second humidity is specified by a dew point temperature of −40° C. or lower.

9. The substrate processing method according to claim 3, wherein the first gas is clean air supplied from a fan filter unit and the second gas is clean dry air or nitrogen gas.

10. The substrate processing method according to claim 7, wherein the first chemical liquid is SC-1 or SC-2.

* * * * *